United States Patent [19]

Green

[11] 4,047,058
[45] Sept. 6, 1977

[54] ALTERNATING CONTROLLER COMPRISING PAIR OF MUTUALLY EXCLUSIVELY-OPERATED TIMERS

[76] Inventor: Aaron F. Green, One Holbrook Court, Rockport, Mass. 01966

[21] Appl. No.: 688,906

[22] Filed: May 21, 1976

[51] Int. Cl.² .................. H03K 5/13; H03K 17/00
[52] U.S. Cl. ........................... 307/293; 307/294; 328/70; 328/75; 328/78; 328/130; 307/252 B
[58] Field of Search .......... 307/294, 293, 265, 252 B; 328/70, 75, 78, 130, 131, 129

[56] References Cited

U.S. PATENT DOCUMENTS

| | | | |
|---|---|---|---|
| 3,388,346 | 6/1968 | Roof et al. | 307/265 |
| 3,611,204 | 10/1971 | Boenning | 307/265 |
| 3,628,068 | 12/1971 | Long et al. | 307/293 |
| 3,670,209 | 6/1972 | Hensen | 328/131 |
| 3,697,879 | 10/1972 | Holliday | 307/293 |
| 3,721,908 | 3/1973 | Jurjans | 328/131 |
| 3,876,950 | 4/1975 | O'Connor | 328/130 |

*Primary Examiner*—Stanley D. Miller, Jr.
*Attorney, Agent, or Firm*—Wolf, Greenfield & Sacks

[57] ABSTRACT

An electronic controller having a pair of sequential outputs for energizing a line voltage AC load or loads in the manner of a single pole double throw (SPDT) switch. The controller comprises a pair of mutually exclusively operated timers, each having an adjustable timing circuit associated therewith. The output from each timer operates a triac which couples power to the load. A termination circuit including a pair of flip-flops and an operating switch is associated with the timers for terminating at any time the present state of the controller and commencing the other state without introducing a timing error.

18 Claims, 1 Drawing Figure

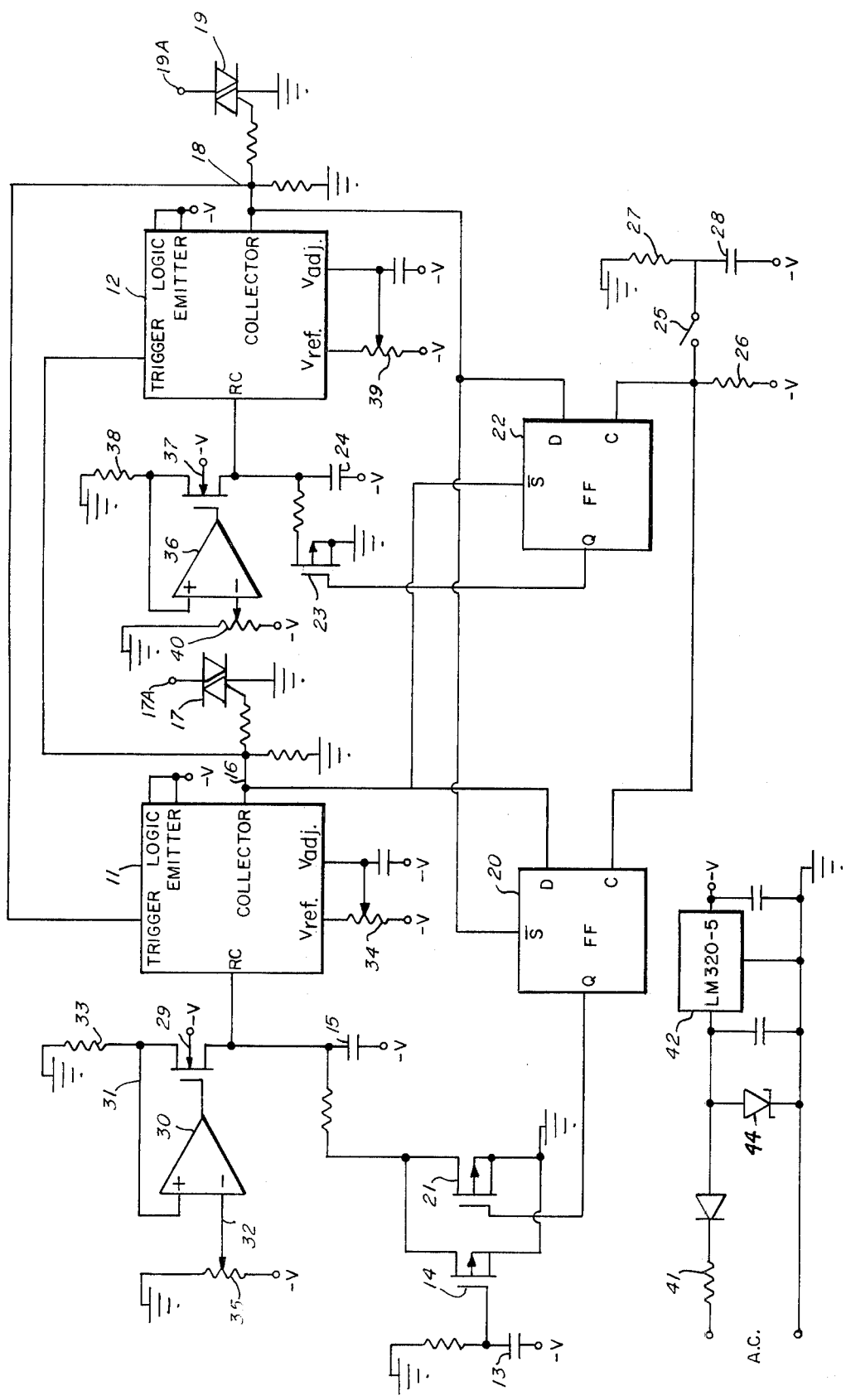

ALTERNATING CONTROLLER COMPRISING PAIR OF MUTUALLY EXCLUSIVELY-OPERATED TIMERS

BACKGROUND OF THE INVENTION

The present invention relates in general to an electronic sequential controller, and is concerned more particularly, with a sequential controller having complementary outputs for energizing a line voltage AC load. The sequential controller of this invention operates analagously to single pole double throw switch.

Sequential controllers of line voltage loads have heretofore lacked one or more of the following desirable features; solid state reliability with no mechanical contactors, accurate timing periods, independent adjustability of timing periods over a wide range, linear control of timing periods, simple and reliable abort and advance means, low power dissipation permitting transformerless line voltage operation, and low cost. The object of the present invention is to satisfy all of the above criteria with a relatively simply constructed electronic sequential controller.

SUMMARY OF THE INVENTION

To accomplish the foregoing and other objects of this invention there is provided an electronic sequential controller for controlling the power applied to a load or a pair of loads. The sequential controller comprises a pair of electronic timers each having a trigger input and an output. Each of these timers also has a timing circuit associated therewith adjustable to control the time period of each timer. The output from the pair of timers couples respectively to a pair of electronic switches which in the preferred embodiment are triacs. A termination circuit is associated with the pair of timers for terminating at any time the present state of controller and commencing the other state. The termination circuit includes a pair of flip-flops and an operating switch which couples to each of these flip-flops for controlling operation thereof. The flip-flops are connected to the timing circuits associated with each timer in a fashion so that when the operating switch is actuated the operating time period is terminated and the other time has its timing period initiated.

BRIEF DESCRIPTION OF THE DRAWINGS

Numerous other objects, features and advantages of the invention will now become apparent upon a reading of the following detailed description taken in conjunction with the sole drawing which is a schematic circuit block diagram of a preferred form of the sequential controller.

DETAILED DESCRIPTION

Referring now to the drawing, there are shown the integrated circuit electronic timers 11 and 12 and associated triacs 17 and 19, respectively. The timers 11 and 12 may be of the LM322 type manufactured by National Semiconductor Corporation of Santa Clara, Calif. Both of these timers have the inherent characteristic of commencing their timing period when the circuit is powered-up. Timers 11 and 12 are configured for active low outputs, e.g. when timer 11 is timing its output 16 is low supplying gate current to triac 17 and thereby maintaining the on state of triac 17.

In accordance with the control of this invention means are provided so that both timers are not operating at the same time. This means includes capacitor 13 and is for resetting the timer 11 at power-up. At power-up capacitor 13 charges slowly, momentarily turning on MOS FET (field effect transistor) 14, thereby rapidly charging the timing capacitor 15 associated with timer 11. In effect, the circuit including transistor 14 causes a rapid termination of the time period by rapidly charging capacitor 15 to the threshhold voltage of the timer necessary for causing a resetting of the timer. When the timer is reset the output from timer 11 on line 16 goes high turning off the triac 17. The positive-going signal on the output line 16 is also coupled to the trigger input of timer 12 for commencing the timer period of timer 12. Under initial conditions of course; that is at power-up timer 12 is already triggered on, a time period having previously commenced at power up. When timer 12 has its timer period terminate the output therefrom on line 18 goes to its high level turning off triac 19. This positive-going signal on line 18 also couples to the trigger input of timer 11 for commencing the on time period of timer 11. Thus, the timers 11 and 12 are operated in a flip-flop type manner with the termination of one timing period initiating the other timing period. The triacs 17 and 19 effectively form an electronic single pole double throw switch with the individual dwell times determined by the timer periods of timers 11 and 12. The outputs 17a and 19a of triacs 17 and 19 couple to the load. For example, the load may be a device including one or more motors having inputs that are to be controlled by an AC voltage over a prescribed period of time.

With the circuit shown in the drawing provision is made for terminating at any time the present state of the controller and commencing the opposite state without introducing a timing error. This circuitry includes flip-flops 20 and 22 and switch 25 which may be a momentary on-off switch. It is noted that the Q outputs of the flip-flops 20 and 22 couple to the MSO FET transistors 21 and 23, respectively. This termination circuit is constructed to terminate the state of the controller that is presently operating and causes initiation of the opposite state. For example, if it is assumed that timer 11 is operating and timer 12 is off then the output on line 18 is at its high level and the output on line 16 is at its low level. The output on line 16 couples to the D input of flip-flop 20 while the output on line 18 couples to the S input of flip-flop 20. When these conditions exist and switch 25 is closed the Q input from flip-flop 20 goes low which turns on the transistor 21 thereby rapidly charging capacitor 15 to reset timer 11 to its off condition. When this occurs the output on line 16 which couples to timer 12 also initiates operation of timer 12.

Under the conditions wherein timer 11 is one and timer 12 is off, when the switch 25 is closed flip-flop 22's D input signal is high while the S input is low. Thus, there is essentially no output from the flip flop 22 for resetting the timer 12. However, if the switch 25 is operated when the timers are in the other position; that is when timer 11 is off and timer 12 is on then the low level Q output from flip-flop 22 turns on transistor 23 which in turn rapidly charges the timing capacitor 24 associated with timer 12. This occurs only when the flip-flop 22 is clocked while the output on line 18 is low and the output on line 16 is high.

In the drawing it is noted that a clock pulse is applied to both flip-flops 20 and 22 at the time that momentary switch 25 is operated. Resistors 26 and 27 along with capacitor 28 comprise a pulse forming network which produces a brief positive clock pulse at the closure of switch 25. This pulse is independent of any switch bounce that may occur at the switch 25. As soon as switch 25 is closed the voltage across capacitor 28 cannot instantaneously change and thus a positive-going pulse is coupled immediately to both filp-flops 20 and 22.

Accurate and linear control of the periods of each of the timers 11 and 12 is provided by the use of voltage-controlled current sources which connect to the RC input of each of the timers 11 and 12. One current source comprises FET transistor 29 and operational amplifier 30 coupling to timer 11 while the other network comprises operational amplifiers 36 and transistor 37 which couple to the other timer 12. The gate electrode of transistor 29 is controlled from the output of amplifier 30. Amplifier 30 is an operational amplifier which is designed to maintain the voltage on line 31 essentially equal to the voltage on input line 32. Since this arrangement impresses a constant voltage across and hence a constant current through resistor 33, the charging current of capacitor 15 is maintained constant rather than being of an exponential varying form. Transistor 29 and amplifier 30 have bias currents that are negligible compared to the charging current of capacitor 15. The resistor 34 coupled to the reference input of timer 11 is used for linear control of the time period of timer 11 over a range extending from a fraction of a second to several minutes while potentiometer 35 is used for full scale trim.

Similarly, another current source arrangement including transistor 37 an amplifier 36 is provided and is similar to the current source associated with timer 11. Amplifier 36 and transistor 37 comprise a voltage controlled current source for the constant current charging of capacitor 24 through resistor 38. A variable resistor 39 provides operational control of the time period of timer 12 while potentiometer 40 provides a full scale trim.

The drawing also shows a DC voltage supply which may be connected to a conventional AC outlet. This voltage supply includes a limiting resistor 41 and a zener diode 44. The supply also includes a voltage regulator 42 which is part No. LM320-5 produced by National Semiconductor Corporation. This power supply provides the necessary voltages for the remainder of the circuit which include a ground voltage and voltage −V.

The use of low powered integrated circuits and sensitive gate triacs has resulted in a total measured current drain of only about 20 milliamps including even the quiescent current of the voltage regulator 42. Despite the lower power consumption of the controller it can operate line voltage loads of several amperes. A particular cost savings is realized by the use of integrated MOS FET transistors rather than the use of discrete transistors. The transistors 14, 21, 23, 39 and 37 might also be contained in a pair of integrated circuit chips identified by part No. CD4007 produced by National Semiconductor Corporation.

What is claimed is:

1. An electronic controller for controlling the power applied to at least one load comprising;
   first and second timers each having a trigger input, a timing input and an output,
   means coupling the output of the first timer and trigger input of the second timer, and the output of the second timer and trigger input of the first timer to provide dependent operation between timers,
   a pair of electronic switches coupling, respectively, from the output of the first and second timers to the load,
   first and second charging circuits coupled to the timing input of the first and second timers, respectively, for providing a predetermined time interval of operation of each timer,
   and timer selection means including manual switch means coupled to the timing input of at least one of said timers for changing the state thereof.

2. A controller as set forth in claim 1 wherein each charging circuit comprises a timing capacitor and a linear current circuit each coupling to the timing input of the timers.

3. A controller as set forth in claim 2 wherein each linear current circuit comprises an operational amplifier and a field effect transistor having its gate coupled from the output of the amplifier, the operational amplifier controlling the resistance of the field effect transistor through which a constant current flows to charge the associated timing capacitor.

4. A controller as set forth in claim 1 wherein said timer selection means includes a pair of flip-flops responsive, respectively, to the state of the timers and having outputs, coupled, respectively, to the first and second charging circuits.

5. A controller as set forth in claim 3 including a variable resistor coupling to an input of each amplifier for varying the timer period of each timer.

6. A controller as set forth in claim 1 wherein each electronic switch comprises a triac.

7. A controller as set forth in claim 1 including circuit means coupling from an AC line to provide DC voltages to the timers.

8. A controller as set forth in claim 4 wherein each flip-flop has a clock input, an output, a data input and a set input, means coupling the data inputs from the outputs of each timer, respectively, and means coupling the set inputs from the opposite outputs of each timer, respectively.

9. A controller as set forth in claim 8 including means coupling the manual switch means to both clock inputs of the flip-flops.

10. A controller as set forth in claim 4 including a pulse-forming network coupled to the manual switch means and including capacitive and resistive means rendering the manual switch means independent of mechanical contact bounce and dwell time.

11. An electronic controller for controlling the power applied to at least one load, comprising;
   first and second timers each having a trigger input, a timing inpur and an output,
   means coupling the output of the first timer and the trigger input of the second timer, and the output of the second timer and trigger input of the first timer to provide dependent operation between timers,
   a pair of electronic switches coupling, respectively, from the output of the first and second timers to the load,
   first and second charging networks coupled to the timing input of the first and second timers, respectively, for providing a predetermined time interval of operation of each timer,
   and means for resetting the first timer to an opposite state at power-up.

12. A controller as set forth in claim 11 wherein said charging networks each comprise a current source means and a timing capacitor.

13. A controller as set forth in claim 12 wherein said current source means includes a amplifier means and a transistor, the amplifier means having a biased input and an output coupled to the control electrode of the transistor, and the transistor having an output electrode coupled in common with one side of the timing capacitor to the timing input of the timer.

14. A controller as set forth in claim 13 wherein said means for resetting includes a rapid charging circuit coupled to the timing capacitor associated with the first timer for rapidly charging the timing capacitor at power-up to terminate the initial interval of the first timer and commence alternating action between timers.

15. A controller as set forth in claim 14 wherein said rapid charging circuit includes a field effect transistor having its output coupled to the timing capacitor and a series resistor and capacitor coupled to the input of the field effect transistor.

16. A controller as set forth in claim 11 wherein said means for resetting includes a rapid charging circuit coupled to the timing input of the first timer.

17. A controller as set forth in claim 11 including timer selection means including manual switch means coupled to the timing input of at least one of said timers.

18. A controller as set forth in claim 17 including two outputs from said timer selection means coupling, respectively, to the timers.

* * * * *